(12) United States Patent
Kim

(10) Patent No.: US 7,525,857 B2
(45) Date of Patent: Apr. 28, 2009

(54) INPUT/OUTPUT LINE PRECHARGE CIRCUIT AND SEMICONDUCTOR MEMORY DEVICE INCLUDING INPUT/OUTPUT LINE PRECHARGE CIRCUIT

(75) Inventor: Jong Hwan Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 13 days.

(21) Appl. No.: 11/648,444

(22) Filed: Dec. 29, 2006

(65) Prior Publication Data

US 2008/0002496 A1   Jan. 3, 2008

(30) Foreign Application Priority Data

Jun. 30, 2006   (KR) ...................... 10-2006-0061580

(51) Int. Cl.
*G11C 7/00*   (2006.01)
(52) U.S. Cl. .................................. 365/203; 365/189.09
(58) Field of Classification Search ................. 365/203, 365/205, 207, 189.01, 189.09
See application file for complete search history.

(56) References Cited

U.S. PATENT DOCUMENTS 6,191,990 B1* 2/2001 Itoh et al. .................... 365/208
7,266,030 B2* 9/2007 Do et al. ..................... 365/207
2006/0092735 A1* 5/2006 Do et al. ..................... 365/207

FOREIGN PATENT DOCUMENTS

| KR | 2001-0003914 A | 1/2001 |
|---|---|---|
| KR | 2001-0029139 A | 4/2001 |
| KR | 2001-0062736 A | 7/2001 |
| KR | 2004-0050534 A | 6/2004 |
| KR | 2004-0076729 A | 9/2004 |

* cited by examiner

*Primary Examiner*—Gene N. Auduong
(74) *Attorney, Agent, or Firm*—Ladas & Parry LLP

(57) ABSTRACT

An input/output line precharge circuit to further supply an auxiliary current other than a main current for precharge for a predetermined time on a precharge operation interval, and includes a write driver that transmits data received or transmitted via a global input/output line to a main input/output line, a precharge portion that precharges the main input/output line with a main current, and a precharge controller that supplies an auxiliary current for precharge for a predetermined time on a precharge operation interval to the precharge portion, and the precharge controller includes a voltage supply controller for generating a pulse to control a supply of the auxiliary current in response to at least one of the write enable signal, precharge signal, or data input/output mode signal; and a voltage supply portion supplying the auxiliary current to the precharge portion by a pulse outputted from the voltage supply controller.

20 Claims, 6 Drawing Sheets

INPUT/OUTPUT LINE PRECHARGE CIRCUIT AND SEMICONDUCTOR MEMORY DEVICE INCLUDING INPUT/OUTPUT LINE PRECHARGE CIRCUIT

CROSS-REFERENCE TO RELATED APPLICATIONS

The present application claims priority to Korean patent application number 10-2006-0061580 filed on Jun. 30, 2006, which is incorporated herein by reference in its entirety.

BACKGROUND OF THE INVENTION

The present invention relates to a semiconductor memory device, and more particularly, to an input/output line precharge circuit, which controls the current (core voltage) for precharge when precharging an input/output line.

In general, a semiconductor memory device, as shown in FIG. 1, includes a write driver 10 which transmits write data DIN through a global input output line pair (GIOT/GIOB) to a main input/output line pair (MIOT/MIOB) at a data input/output pad (DQ PAD) when performing a write operation, and a precharge portion 20 which precharges the main input/output line pair (MIOT/MIOB) with a core voltage VCORE after a write or read operation.

A write driver 10 includes a controller 11 that outputs write control signals WE and WEB using a latch signal YIOW for latching the write data and a signal AYIOS for selecting a data input/output mode, a latch portion 12 that latches the write data DIN inputted by the write control signals WE and WEB, a transmission portion 13 that transmits the latched data, and a driving portion 14 that drives the main input/output line pair (MIOT/MIOB) according to the transmitted data.

The controller 11 comprises a NAND gate (ND1) for NANDing a latch signal YIOW and a data input/output mode selection signal AYIOS, and an inverter (INV1) for inverting a signal outputted from the NAND gate (ND1).

The latch portion 12 comprises an inverter (INV2) that inverts the write data DIN by the write control signals WE and WEB, an inverter (INV3) that inverts the data outputted from the inverter (INV2), and an inverter (INV4) that inverts the data outputted from the inverter (INV3) by the write control signals WE and WEB to provide to an input terminal of the inverter (INV3).

The transmission portion 13 comprises a NAND gate (ND2) that selectively transmits data outputted from the inverter (INV3) according to the write control signal WE, inverters (INV5, INV6) that respectively output a second pull-down signal MIDB and a second pull-up signal MIUB using data transmitted from the NAND gate (ND2), a NAND gate (ND3) that selectively transmits data outputted from the inverter (INV2) according to the write control signal WE, and inverters (INV7, INV8) that respectively output a first pull-down signal MIDT and a first pull-up signal MIUT using data transmitted from the NAND gate (ND3).

The driving portion 14 comprises a PMOS transistor (PM1) that pulls up the main input/output line (MIOT) to a core voltage VCORE by the first pull-up signal MIUT, a NMOS transistor (NM1) that pulls down the main input/output line (MIOT) to a ground voltage VSS by the first pull-down signal MIDT, a PMOS transistor (PM2) that pulls up the main input/output line (MIOB) to the core voltage VCORE by the second pull-up signal MIUB, and a NMOS transistor (NM2) that pulls down the main input/output line (MIOB) to the ground voltage VSS by the second pull-down signal MIDB.

On the other hand, the precharging portion 20 comprises inverters (INV9~INV11) that invert a precharge signal MIPC with a delay to output to a precharge control signal MIPCB, a PMOS transistor (PM3) that connects the main input/output line pair (MIOT, MIOB) by the precharge control signal MIPCB, and PMOS transistors (PM4, PM5) that precharge the main input/output line pair (MIOT, MIOB) with the core voltage VCORE by the precharge control signal MIPCB.

Looking into an operation of the write driver 10 and the precharge portion 20 in the prior art as described above, first, the main input/output line pair (MIOT, MIOB) is precharged with the core voltage VCORE by the precharge signal MIPC during a precharge operation. When a write operation is initiated, the precharge operation is canceled as the precharge signal MIPC is disabled thereby canceling the precharge operation, and write data DIN is transmitted to the main input/output line pair (MIOT, MIOB). At this time, during the write operation, any one of the main input/output line pair (MIOT, MIOB) is pulled down to the ground voltage VSS, thereby avoiding a degradation of the core voltage VCORE level.

Furthermore, after the write data DIN is transmitted to a bit line pair through the pair of main input/output lines (MIOT, MIOB), the precharge operation is initiated again upon the separation of the bit line pair and the input/output line pair by the column select signal. At this time, there is a problem that current consumption of the core voltage VCORE is generated because the main input/output line pair (MIOT, MIOB) should be precharged again with the core voltage VCORE.

Particularly, when it is in an x16 mode in which data is inputted and outputted in a 16-bit unit, 64 pairs of the main input/output lines (MIOT, MIOB) are precharged for a bank, and therefore, 2 or 4 times of the core voltage VCORE current consumption can be generated compared to an x8 in which data is inputted and outputted in an 8-bit unit, or an x4 in which data is inputted and outputted in a 4-bit unit.

Moreover, when the write operation is performed continuously, the driving capability of the core voltage VCORE driver is unable to follow the operation, and the delay in the response characteristic of the analog VCORE driver generates a severe reduction of the core voltage VCORE during the initial write operation. Accordingly, the above configuration risks the possibility of generating an error during a read operation due to the reduced core voltage VCORE written in the memory cell.

SUMMARY OF THE INVENTION

The present invention further supplies an auxiliary current, other than a main current, for precharge for a certain time upon a precharge operation interval, thereby preventing a voltage level reduction in the power supplying the main current.

The present invention also supplements the current that is required for precharge as the power is applied to a source voltage VDD for a certain time upon a precharge operation, thereby preventing a reduction in the core voltage VCORE, which is used for precharging the main input/output line pair (MIOT, MIOB).

The present invention may also control the amount of auxiliary current supplied for precharge, such as a core voltage VCORE, according to a data input/output mode upon a precharge operation, thereby controlling the core voltage VCORE.

The present invention may also control the amount of power applied to a source voltage VDD for precharge, such as the core voltage VCORE, by detecting the source voltage VDD, thereby controlling the core voltage VCORE.

The semiconductor memory device comprises a write driver which transmits data received via a global input/output line to a main input/output line; a precharge portion that precharges the main input/output line with a main current; and a precharge controller that supplies an auxiliary current for precharge for a certain time upon a precharge operation interval to the precharge portion.

Here, preferably, the precharge controller supplies the auxiliary current upon an initial interval of the precharge operation.

Furthermore, the precharge controller may include a voltage supply controller that generates a pulse to control the supply of auxiliary current in response to at least one of a write enable signal, a precharge signal, or a data input/output mode signal; and a voltage supply portion that supplies the auxiliary current to the precharge portion by a pulse outputted from the voltage supply controller.

Here, the precharge controller may use a signal, which is enabled when data in a 4-bit unit is inputted and outputted as the data input/output mode signal.

Furthermore, the voltage supply portion may include a switching means, which is turned on by the pulse to switch a supply of the auxiliary current. Preferably, the switching means, which is driven by the pulse, outputs current supplied from power having a lower voltage than that of power supplying the main current for precharge, as auxiliary current.

Furthermore, the voltage supply controller may include a combining portion that logically combines the write enable signal, the precharge signal, and the data input/output mode signal to output a control signal; and a pulse generating portion that combines the control signal and its delay signal to generate the pulse.

Here, the combining portion may include the first NAND gate NANDing the write enable signal and the precharge signal; the first inverter inverting a signal outputted from the first NAND gate; the second inverter inverting the first data input/output mode signal; the second NAND gate NANDing a signal outputted from the first inverter and a signal outputted from the second inverter; and the third inverter inverting a signal outputted from the second NAND gate to output to the control signal.

Furthermore, the pulse generating portion may include a delay means for delaying the control signal for a certain time; a fourth inverter for inverting a signal outputted from the delay means; the third NAND gate for NANDing the control signal and the signal outputted from the fourth inverter; a fifth inverter for inverting the signal outputted from the third NAND gate; and a sixth inverter for inverting the signal outputted from the fifth inverter to provide to the pulse.

Furthermore, the precharge controller may further include a current controller for controlling the supply of the auxiliary current using at least one of the data input/output mode signals and a detection signal for detecting the voltage level of power providing the auxiliary current. The current controller may use a signal, which is enabled when data in a 16-bit unit is inputted and outputted as the data input/output mode signal. The current controller may include a third switching means for operating by the data input/output mode signal to switch a supply of the auxiliary current; and a fourth switching means being configured in parallel with the third switching means for and operating by the detection signal to switch the supply of the auxiliary current.

Furthermore, preferably, the precharge controller uses current, which is provided from power having a lower voltage level than that of power for providing the main current, as the auxiliary current.

Furthermore, the write driver may include a controller for outputting a write control signal by using a latch signal for latching the write data and a signal for selecting the data input/output mode; a latch portion for latching the write data by the write control signal; a transmission portion for transmitting the latched data and the data in which a phase of the latched data is inverted; and a driving portion for driving the main input/output line pair according to a plurality of data transmitted from the transmission portion.

Furthermore, the precharge portion may include a connection portion for connecting the main input/output line pair to each other by a precharge signal that is enabled during the precharge operation; and a precharge voltage supply portion for supplying the main current to the main input/output line pair by the precharge signal.

On the other hand, an input/output line precharge circuit, used for precharging the data input/output line with the main current according to the present invention, may include a precharge controller portion for supplying an auxiliary current in addition to the main current for the precharge for a certain time on a precharge operation interval, and detecting the voltage level of power for supplying the auxiliary current to control the supply amount of the auxiliary current.

Here, the precharge controller enters into a test mode to perform a precharge operation during a write operation, and when it is a data input/output mode in which the bit of data being inputted/outputted is of a certain value or less, the precharge controller may include a voltage supply controller for generating a pulse for controlling the supply of the auxiliary current; a voltage supply portion for supplying the auxiliary current for the precharge by a pulse outputted from the voltage supply controller; and a current controller for controlling the supply amount of the auxiliary current according to the data input/output mode and a voltage level of the power for supplying the auxiliary current.

Furthermore, the voltage supply controller may disable the pulse when it is in a mode in which data is inputted and outputted in a 4-bit unit.

Furthermore, the current controller may increase the supply amount of the auxiliary current when it is in a mode in which data is inputted and outputted in a 16-bit unit, and increase a supply amount of the auxiliary current when the power voltage for supplying the auxiliary current is low.

Furthermore, the precharge portion may include a connection portion for connecting the main input/output line pair to each other with a precharge signal that is enabled upon the precharge operation; and a precharge voltage supply portion for supplying the main current to the main input/output line pair by the precharge signal.

DESCRIPTION OF SPECIFIC EMBODIMENTS

Hereinafter, preferred embodiments of the present invention will be described in detail with reference to the accompanying figures.

According to the present invention, when an input/output line is precharged during a write operation, the source voltage VDD, of which the amount of current is controlled according to the data input/output mode, and the source voltage VDD level is supplied to power the core voltage VCORE, thereby controlling the core voltage VCORE used for precharge. Here, current supplied for precharge by power for applying the source voltage VDD becomes an auxiliary current, and current supplied for precharge by power for applying the core voltage VCORE becomes a main current.

Figure 1:
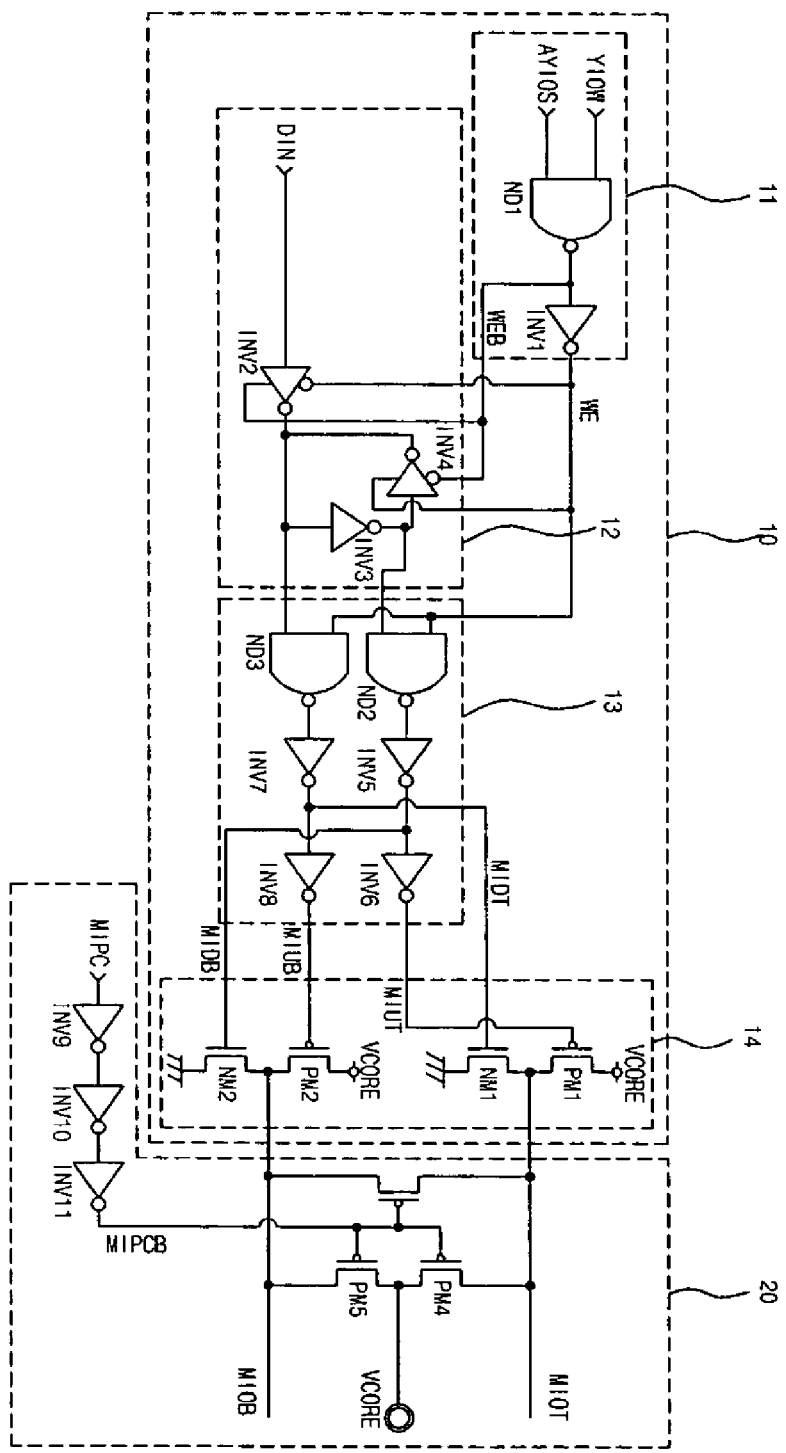
FIG. 1 is a circuit diagram illustrating a part of a write path in a semiconductor memory device.
Figure 2:
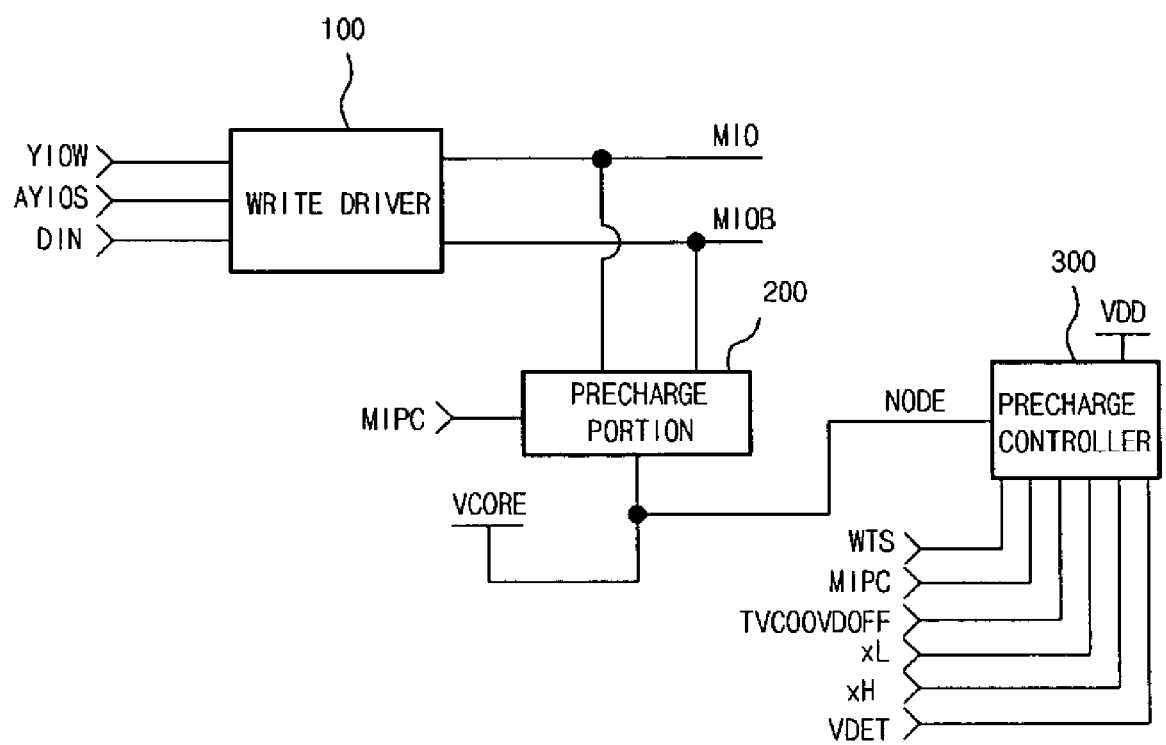
FIG. 2 is a block diagram illustrating a part of a write path in a semiconductor memory device according to an embodiment of the present invention.

Specifically, referring to FIG. 2, the present invention includes a write driver 100, a precharge portion 200, and a precharge controller 300. The write driver 100 transmits write data DIN transmitted from or received at the data input/output pad (DQ PAD) via a global input/output line pair (GIOT/GIOB) to a main input/output line pair (MIOT/MIOB). The precharge portion 200 precharges the main input/output line pair (MIOT/MIOB) with the core voltage VCORE, and when performing a precharge operation during a write operation, the precharge controller 300 operates in a test mode, thereby supplying the source voltage VDD to the core voltage VCORE for a certain time according to the data input/output mode, and detects a level of the source voltage VDD, thereby controlling the current of the source voltage VDD.

Figure 3:
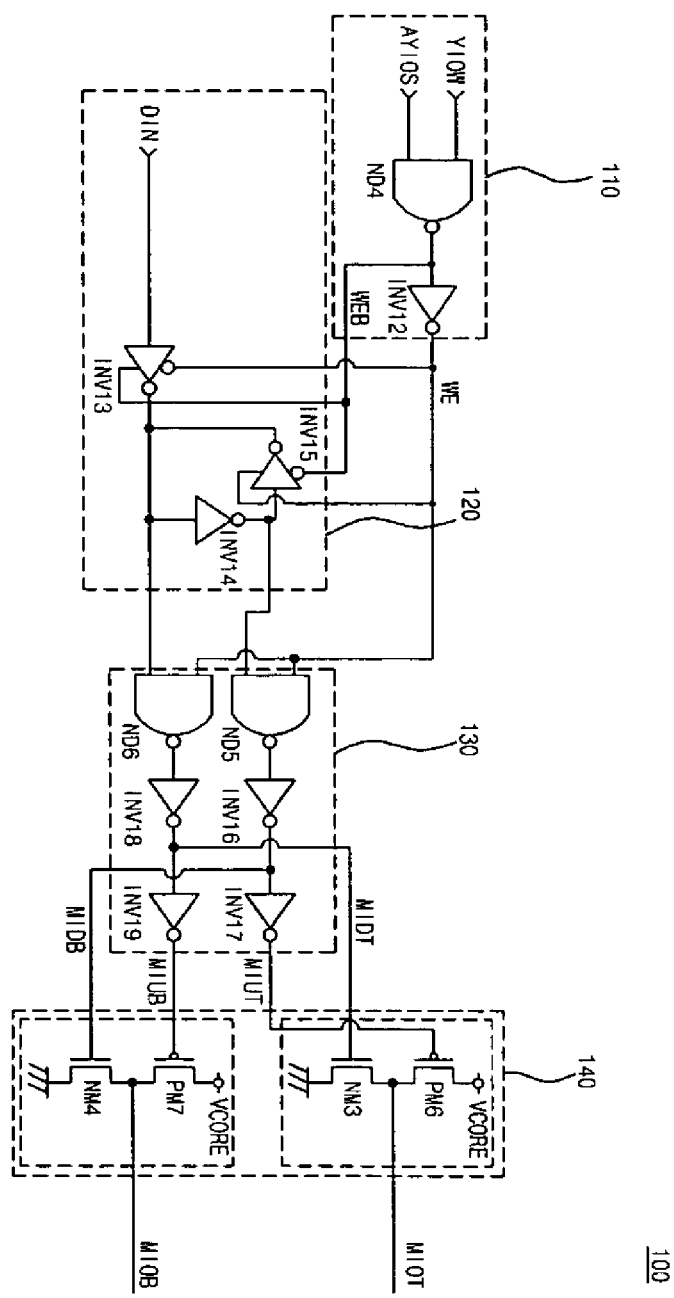
FIG. 3 is a circuit diagram illustrating an example of a write driver 100 of FIG. 2.

The write driver 100, as illustrated in FIG. 3, includes a controller 110 for outputting write control signals WE and WEB using a latch signal YIOW for latching write data and a signal AYIOS for selecting the data input/output mode, a latch portion 120 for latching the write data DIN inputted by the write control signals WE and WEB, a transmission portion 130 for transmitting the latched data, and a driving portion 140 for driving the main input/output line pair (MIOT/MIOB) according to the transmitted data.

The controller 110 may include a NAND gate (ND4) for NANDing the latch signal YIOW and the data input/output mode selection signal AYIOS, and an inverter (INV12) for inverting a signal outputted from the NAND gate (ND4).

The latch portion 120 may include an inverter (INV13) for inverting the write data DIN by the write control signals WE and WEB, an inverter (INV14) for inverting data outputted from the inverter (INV13), and an inverter (INV15) for inverting data outputted from the inverter (INV14) by write control signals WE and WEB to provide to an input terminal of the inverter (INV14).

The transmission portion 130 may include a NAND gate (ND5) for selectively transmitting data outputted from the inverter (INV14) according to the write control signal WE, inverters (INV16, INV17) for respectively outputting a second pull-down signal MIDB and a second pull-up signal MIUB using data transmitted from the NAND gate (ND2), a NAND gate (ND6) for selectively transmitting data outputted from the inverter (INV13) according to the write control signal WE, and inverters (INV18, INV19) for respectively outputting a first pull-down signal MIDT and a first pull-up signal MIUT using data transmitted from the NAND gate (ND6).

The driving portion 140 includes a driving portion 141 for driving a main input/output line (MIOT), and a driving unit 142 for driving a main input/output line (MIOB).

Here, the driving part 141 may include a PMOS transistor type pull-up element (PM6) for pulling up the main input/output line (MIOT) to a core voltage VCORE by the first pull-up signal MIUT, and a NMOS transistor type pull-down element (NM3) for pulling down the main input/output line (MIOT) to the ground voltage VSS by the first pull-down signal MIDT.

Furthermore, the driving portion 142 may include a PMOS transistor type pull-up element (PM7) for pulling up the main input/output line (MIOB) to the core voltage VCORE by the second pull-up signal MIUB, and a NMOS transistor type pull-down element (NM4) for pulling down the main input/output line (MIOB) to the ground voltage VSS by the second pull-down signal MIDB.

Looking into an operation of the write driver 100 as configured in FIG. 3, after the write data DIN is inputted, when the data input/output mode selection signal AYIOS is enabled according to the relevant mode after a predetermined time elapses and the latch signal YIOW is generated by a pulse, valid write data DIN is normally latched in the latch portion 120 and provided to the transmission portion 130.

Furthermore, data transmitted to the transmission portion section 130 is generated in first and second pull-up signals MIUT and MIUB and first and second pull-down signals MIDT and MIDB to operate the driving portion 140, and the driving portion 140 performs a pull-up or pull-down operation according to the MIUT, MIUB, MIDT, and MIDB, thereby transmitting the core voltage VCORE to any one of the main input/output line pair (MIOT, MIOB), and transmitting the ground voltage VSS to the other one.

Figure 4:
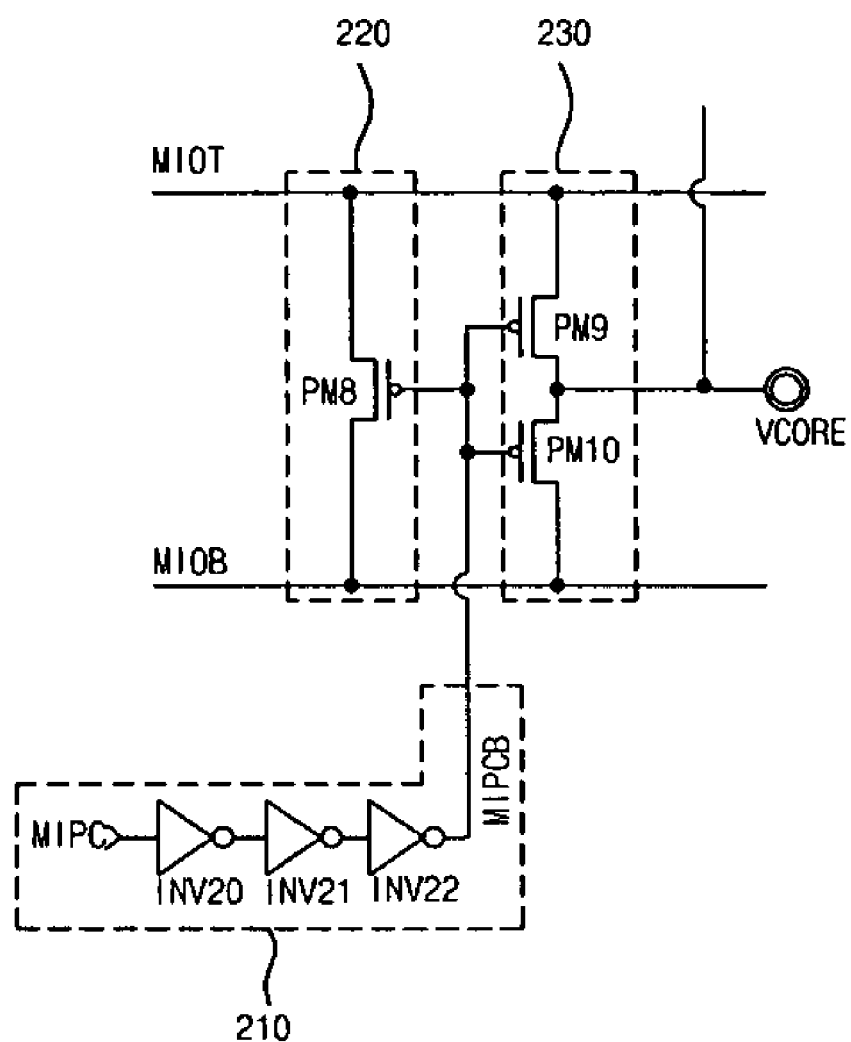
FIG. 4 is a circuit diagram illustrating an example of the precharge portion 200 of FIG. 2.

The precharge portion 200, as illustrated in FIG. 4, includes a precharge controller 210 for using a precharge signal MIPC which is enabled during the precharge operation to output to a precharge control signal MIPCB, a connection portion 220 for connecting the main input/output line pair (MIOT, MIOB) to each other by the precharge control signal MIPCB, and a precharge voltage supply portion 230 for supplying the core voltage VCORE to the main input/output line pair (MIOT, MIOB) by the precharge control signal MIPCB.

The precharge controller 210 may include an inverter chain for inverting the precharge signal MIPC with a delay to output to the precharge control signal MIPCB. Here, the inverter chain preferably includes an odd number of inverters (INV20, INV21, INV22), which are serially connected to one another.

The connection portion 220 may include a PMOS transistor type switching element (PM8), which is turned on by the precharge signal MIPC to connect the main input/output line pair (MIOT, MIOB) to each other.

The precharge voltage supply portion 230 may include PMOS transistor type pull-up elements (PM9, PM10), which are turned on by the precharge signal MIPC to supply the core voltage VCORE to the main input/output line pair (MIOT, MIOB) respectively.

In the precharge portion 200 as configured in FIG. 4, as the precharge signal MIPC is enabled, the core voltage VCORE is supplied to the main input/output line pair (MIOT, MIOB) respectively, and at the same time the main input/output line pair (MIOT, MIOB) is connected to each other, thereby maintaining each of the main input/output line pairs (MIOT, MIOB) at the same level.

Figure 5:
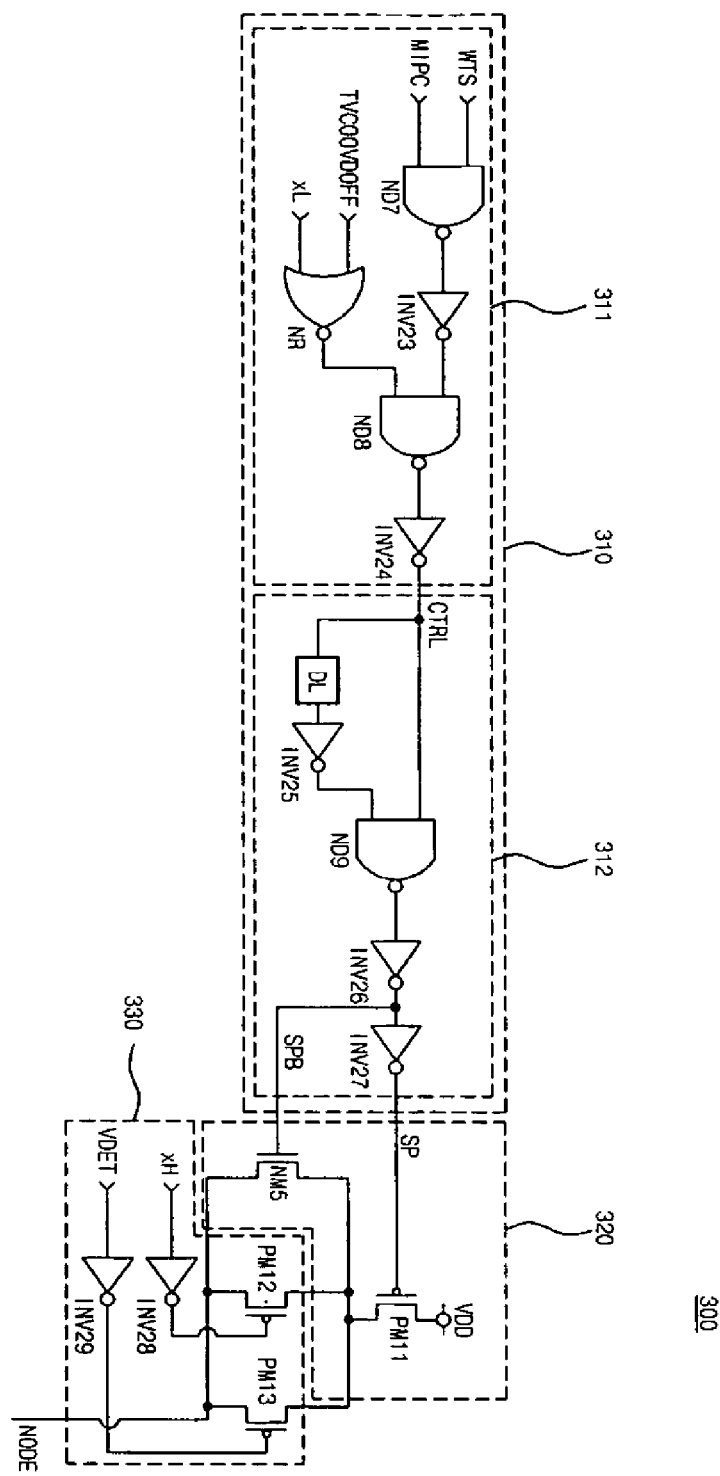
FIG. 5 is a circuit diagram illustrating an example of a precharge controller 300 of FIG. 2.

The precharge controller 300, as illustrated in FIG. 5, includes a voltage supply controller 310 for generating a pulse SP to control a supply of the source voltage VDD using a write enable signal WTS that is enabled during the write operation, a precharge signal MIPC, a data input/output mode signal xL that is enabled when the width of data being inputted/outputted is small, a test signal TVCOOVDOFF that is enabled when exiting from a test mode, a voltage supply portion 320 for supplying the source voltage VDD by the pulse SP to a node (NODE) to which the core voltage VCORE is transmitted, a current controller 330 for controlling the supply current of the source voltage VDD using the data input/output mode signal xH that is enabled when the width of data being inputted/outputted is large, and a detection signal VDET by which a level of the source voltage VDD is detected.

Here, the data input/output mode signal xL is a signal that is enabled when the number of bits being inputted and outputted is small, such as an x4 signal in which data is inputted and outputted in a 4-bit unit, and the data input/output mode signal xH is a signal that is enabled when the number of bits being inputted and outputted is large, such as an x16 signal in which data is inputted and outputted in a 16-bit unit. Furthermore, the detection signal VDET is a signal that is enabled when the source voltage VDD is low and disabled when the source voltage VDD is high.

The voltage supply controller 310 includes a combining portion 311 for logically combining the write enable signal WTS, the precharge signal MIPC, the data input/output mode signal xL, the test signal TVCOOVDOFF to output to a control signal CTRL, and a pulse generating portion 312 for combining the control signal CTRL and an inverted control signal CTRL with a delay to generate the pulse SP.

Here, the combining portion 311 may include a NAND gate (ND7) for NANDing the write enable signal WTS and the precharge signal MIPC, an inverter (INV23) for inverting a signal outputted from the NAND gate (ND7), a NOR gate (NR) for NORing the data input/output mode signal xL and the test signal TVCOOVDOFF, a NAND gate (ND8) for NANDing a signal outputted from the inverter (INV23) and a signal outputted from the NOR gate (NR), and an inverter (INV24) for inverting a signal outputted from the NAND gate (ND8) to output to the control signal CTRL.

Furthermore, the pulse generating portion 312 may include a delay element (DL) for delaying the control signal CTRL for a certain time, an inverter (INV25) for inverting a signal outputted from the delay element (DL), a NAND gate (ND9) for NANDing the control signal CTRL and a signal outputted from the inverter (INV25), an inverter (INV26) for inverting a signal outputted from the NAND gate (ND9) to provide the inversion pulse SPB, and an inverter (INV27) for inverting a signal outputted from the inverter (INV26) to provide the pulse SP.

The voltage supply portion 320 may include a PMOS transistor type pull-up element (PM11), which is turned on by the pulse SP to supply the source voltage VDD, and a NMOS transistor type switching element (NM5), which is turned on by the inversion pulse SPB to form a first current path for providing the source voltage VDD to the node (NODE).

The current controller 330 may include an inverter (INV28) for inverting the data input/output mode signal xH, a PMOS transistor type switching element (PM12) that is turned on by a signal outputted from the inverter (INV28) to form a second current path for providing the source voltage VDD to a node (NODE), an inverter (INV29) for inverting the detection signal VDET, and a PMOS transistor type switching element (PM13) that is turned on by the detection signal VDET to form a third current path for providing the source voltage VDD to the node (NODE).

In the voltage supply controller 310 as configured in FIG. 5, when the write enable signal WTS and the precharge signal MIPC are both enabled, and the test signal TVCOOVDOFF and the data input/output mode signal xL are both disabled, a pulse SP for supplying voltage is generated by the control signal CTRL and an inverted control signal CTRL with a delay.

Furthermore, the supply voltage VDD is supplied by the pulse SP through the first current path to a core voltage VCORE node (NODE) of the precharge portion 200. At this time, the source voltage VDD is also transmitted to the second current path when the data input/output mode signal xH is enabled, and the source voltage VDD is also transmitted to the third current path when the detection signal VDET is enabled. In other words, the source voltage VDD is provided to the node (NODE) since the amount of current is controlled by the data input/output mode signal xH and the detection signal VDET.

Figure 6:
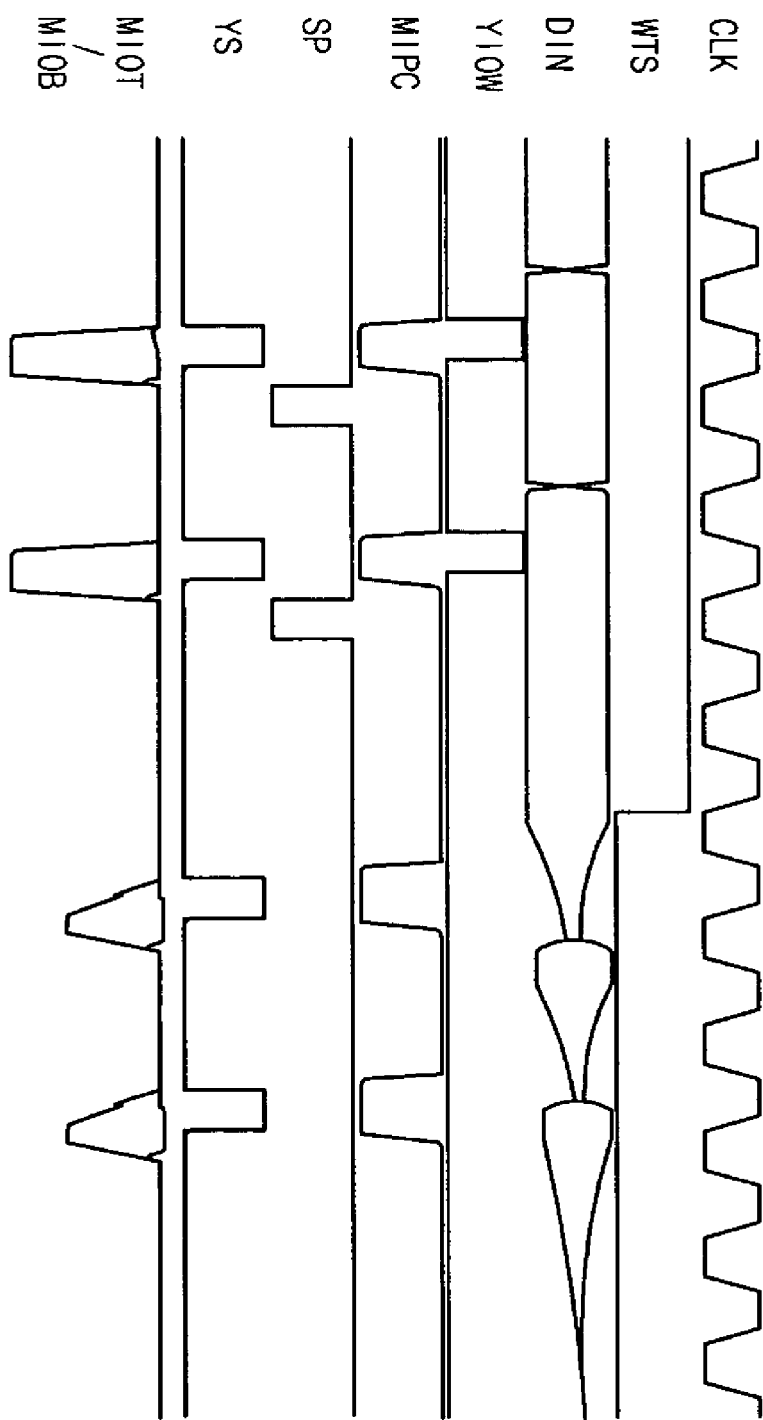
FIG. 6 is a waveform diagram illustrating an operation of FIG. 2.

Hereinafter, the operation of embodiments of the present invention will be described in detail with reference to FIG. 6.

According to an embodiment of the present invention, when the write enable signal WTS and the precharge signal MIPC are enabled, that is, when a precharge controller 300 performs a precharge operation during the write operation, the precharge controller 300 is driven, and the source voltage VDD is supplied to generate the core voltage VCORE for a certain interval during the precharge operation. On the other hand, when it is in a data input/output mode in which current consumption of the core voltage VCORE is small, for example, an x4 mode, the precharge controller 300 is not operated.

First, after write data DIN is latched by the latch signal YIOW, the level of the core voltage VCORE and the ground voltage VSS are respectively written to a main input/output line pair (MIOT, MIOB). Thereafter, the main input/output line pair (MIOT, MIOB) is precharged to the core voltage VCORE level by the precharge signal MIPC.

At this time, when all of the write enable signals WTS are in an enable state, and when the precharge signal MIPC is changed from a disabled state to an enabled state, a pulse SP is generated and the power source voltage VDD is supplied to power the generation of the core voltage VCORE. Furthermore, the detection signal VDET and the data input/output mode signal xH control the amount of current supply of the source voltage VDD. Thereafter, when the pulse SP is disabled according to a delay of the precharge signal MIPC, the current supply of the source voltage VDD is interrupted.

In other words, according to an embodiment of the present invention, when current consumption of the core voltage VCORE is large, such as when performing a precharge operation during the write operation, the source voltage VDD is supplied to power the core voltage VCORE, thereby stably maintaining the level of the core voltage VCORE.

Moreover, when the amount of current supplied to power the core voltage VCORE is controlled according to the level of the source voltage VDD, the present invention prevents a rise in the core voltage VCORE level according to the supply of the source voltage VDD.

Additionally, when the amount of current for supplying the power source voltage VDD is controlled according to a data input/output mode, the present invention reduces current consumption due to the supply of the source voltage VDD in a data input/output mode in which current consumption of the core voltage VCORE is small.

In this way, according to the present invention, when the current consumption of the core voltage VCORE is large during the performance of a precharge operation during the write operation, the source voltage VDD is supplied to power the core voltage VCORE for a certain time, thereby stably maintaining a level of the core voltage VCORE used for the precharge of a main input/output line pair (MIOT, MIOB).

Moreover, according to the present invention, when performing a precharge operation during the write operation, the amount of current of the source voltage VDD is controlled according to the level of the source voltage VDD to supply to the core voltage VCORE, thereby preventing a rise of the core voltage VCORE level according the source voltage VDD.

Additionally, according to the present invention, when performing a precharge operation during the write operation, the amount of current supplied to the power source voltage VDD is controlled according to the data input/output mode to supply power to the core voltage VCORE, thereby reducing current consumption, which is due to the supply of the source voltage VDD in a data input/output mode in which current consumption of the core voltage VCORE is small.

Although preferred embodiments of the present invention have been described for illustrative purposes, the present invention is not limited thereto, and those skilled in the art will appreciate that various modifications, additions and substitutions are possible, without departing from the scope and spirit of the invention as disclosed in the accompanying claims.

What is claimed is:

1. A semiconductor memory device comprising:
    a write driver transmitting data received via a global input/output line to a main input/output line;
    a precharge portion precharging the main input/output line with a main current; and
    a precharge controller supplying an auxiliary current for precharge for a predetermined time on a precharge operation interval, wherein the auxiliary current is supplied to the precharge portion to supplement the main current.

2. The semiconductor memory device according to claim 1, wherein the precharge controller supplies the auxiliary current during an initial interval of the precharge operation.

3. The semiconductor memory device according to claim 2, wherein the precharge controller includes:
    a voltage supply controller generating a pulse to control a supply of the auxiliary current in response to at least one of a write enable signal, a precharge signal, and a data input/output mode signal; and
    a voltage supply portion supplying the auxiliary current to the precharge portion by the pulse outputted from the voltage supply controller.

4. The semiconductor memory device according to claim 3, wherein the precharge controller uses a signal that is enabled when a width of data being inputted and outputted is a 4-bit as the data input/output mode signal.

5. The semiconductor memory device according to claim 3, wherein the voltage supply portion includes a switching means that is turned on by the pulse to switch a supply of the auxiliary current.

6. The semiconductor memory device according to claim 5, wherein the switching means outputs current, which is driven by the pulse and supplied from power having a lower voltage than that of power supplying the main current for precharge, as an auxiliary current.

7. The semiconductor memory device according to claim 3, wherein the voltage supply controller includes:
    a combining portion which logically combines a write enable signal, a precharge signal, and a data input/output mode signal to output as a control signal; and
    a pulse generating portion that combines the control signal and its delay signal to generate the pulse.

8. The semiconductor memory device according to claim 7, wherein the combining portion includes:
    a first NAND gate NANDing the write enable signal and the precharge signal;
    a first inverter inverting a signal outputted from first NAND gate;
    a second inverter inverting the first data input/output mode signal;
    a second NAND gate NANDing a signal outputted from the first inverter and a signal outputted from the second inverter; and
    a third inverter inverting a signal outputted from the second NAND gate to output to the control signal.

9. The semiconductor memory device according to claim 7, wherein the pulse generating portion includes:
    a delay means for delaying the control signal for a predetermined certain time;
    a fourth inverter for inverting a signal outputted from the delay means;
    a third NAND gate for NANDing the control signal and a signal outputted from the fourth inverter;
    a fifth inverter for inverting a signal outputted from the third NAND gate; and
    a sixth inverter for inverting a signal outputted from the fifth inverter to provide to the pulse.

10. The semiconductor memory device according to claim 2, wherein the precharge controller further includes a current controller controlling a supply of the auxiliary current using at least one of a data input/output mode signal and a detection signal detecting voltage level of power providing the auxiliary current.

11. The semiconductor memory device according to claim 10, wherein the current controller uses a signal that is enabled when a width of data being inputted and outputted is a 16-bit as the data input/output mode signal.

12. The semiconductor memory device according to claim 10, wherein the current controller includes:
    a third switching means operated by the data input/output mode signal to switch a supply of the auxiliary current; and
    a fourth switching means configured in parallel with the third switching means and operated by the detection signal to switch the supply of the auxiliary current.

13. The semiconductor memory device according to claim 1, wherein the precharge controller uses current, that is provided from power having a lower voltage level than that of power providing the main current, as the auxiliary current.

14. The semiconductor memory device according to claim 1, wherein the write driver includes:
    a controller that outputs a write control signal by using a latch signal latching the write data and a signal selecting the data input/output mode; a latch portion latching the write data by the write control signal; a transmission portion transmitting the latched data and the data in which a phase of the latched data is inverted; and a driving portion driving the main input/output line pair according to a plurality of data transmitted from the transmission portion.

15. The semiconductor memory device according to claim 1, wherein the precharge portion includes;
    a connection portion connecting the main input/output line pair to each other by a precharge signal that is enabled during the precharge operation; and
    a precharge voltage supply portion supplying the main current to the main input/output line pair by the precharge signal.

16. An input/output line precharge circuit for precharging a data input/output line with a main current, comprising:
    a precharge control portion outputting the main current; and
    a precharge controller supplying an auxiliary current to the precharge control portion to supplement the main current for a predetermined time on a precharge operation interval, and detecting a voltage level of a power supplying the auxiliary current to control a supply amount of the auxiliary current.

17. The input/output line precharge circuit according to claim 16, wherein the precharge controller enters into a test mode to perform a precharge operation during a write operation, and enters into a data input/output mode when a bit of data being inputted/outputted is a predetermined value or less, wherein the precharge controller includes:
- a voltage supply controller for generating a pulse for controlling the supply of the auxiliary current;
- a voltage supply portion for supplying the auxiliary current for the precharge by a pulse outputted from the voltage supply controller; and
- a current controller controlling a supply amount of the auxiliary current according to the data input/output mode and the voltage level of the power for supplying the auxiliary current.

18. The input/output line precharge circuit according to claim 17, wherein the voltage supply controller disables the pulse when it is a mode in which data having a 4-bit width is inputted and outputted.

19. The input/output line precharge circuit according to claim 17, wherein the current controller increases a supply amount of the auxiliary current when it is a mode in which data having a 16-bit width is inputted and outputted, and increases the supply amount of the auxiliary current when a power voltage supplying the auxiliary current is low.

20. The input/output line precharge circuit according to claim 16, wherein the precharge portion includes:
- a connection portion connecting the main input/output line pair to each other by a precharge signal that is enabled during the precharge operation; and
- a precharge voltage supply portion supplying the main current to the main input/output line pair by the precharge signal.

* * * * *